United States Patent
Kaji et al.

(10) Patent No.: US 6,408,020 B1
(45) Date of Patent: Jun. 18, 2002

(54) DUAL-MODE RADIO COMMUNICATION DEVICE HAVING FUNCTION FOR SELECTIVELY USING ANALOG OR DIGITAL MODE

(75) Inventors: Naoki Kaji; Osamu Kurokawa, both of Hino; Akira Ishikura, Kawasaki; Yoshihiro Nomura, Hino; Masakuni Hyodo, Tokyo; Ken Nakamura, Yokohama; Yoshimasa Takahashi, Hachioji, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/380,517
(22) PCT Filed: Jan. 7, 1999
(86) PCT No.: PCT/JP99/00016
§ 371 (c)(1), (2), (4) Date: Sep. 3, 1999
(87) PCT Pub. No.: WO99/35757
PCT Pub. Date: Jul. 15, 1999

(30) Foreign Application Priority Data

Jan. 7, 1998 (JP) .......................................... 10-001652

(51) Int. Cl.$^7$ .............................. H04L 25/00; H04B 1/38
(52) U.S. Cl. .................... 375/216; 455/553; 455/574
(58) Field of Search ........................ 375/216; 455/573, 455/574, 575, 67.7, 127, 552, 553, 343; 320/13, 48

(56) References Cited

U.S. PATENT DOCUMENTS

| 5,248,929 | A | * | 9/1993 | Burke .......................... 320/127 |
| 5,416,829 | A | * | 5/1995 | Umemoto .................... 455/553 |
| 5,677,944 | A | * | 10/1997 | Yamamoto et al. .......... 340/635 |
| 6,321,097 | B1 | * | 11/2001 | Kim ............................ 455/432 |
| 6,332,074 | B1 | * | 12/2001 | Spitaletta et al. ........... 455/407 |

FOREIGN PATENT DOCUMENTS

| JP | 6-21867 | 1/1994 |
| JP | 6-164495 | 6/1994 |
| JP | 9-181804 | 7/1997 |

* cited by examiner

Primary Examiner—Chi Pham
Assistant Examiner—Khai Tran
(74) Attorney, Agent, or Firm—Finnegan, Henderson, Farabow, Garrett, & Dunner, L.L.P.

(57) ABSTRACT

According to the present invention, an analog-mode discharge characteristic storage area (21a) and a digital-mode discharge characteristic storage area (21b) store threshold data of remaining battery display in an incoming-call standby status in an analog mode and that in a digital mode, respectively. A remaining battery determination means (20a) determines a remaining battery level corresponding to a selected communication mode based on both a voltage of detected by a voltage detection circuit (32) and data stored in the analog-mode discharge characteristic storage area (21a) or the digital-mode discharge characteristic storage area (21b). A remaining battery display control means (20b) causes the remaining battery to be displayed on an LCD display of a control unit (22) in accordance with a determination result of the remaining battery determination means (20a).

8 Claims, 3 Drawing Sheets

| THRESHOLD VOLTAGE OF BATTERY IN ANALOG MODE | DISPLAY OF REMAINING BATTERY |
|---|---|
| 5.2V OR HIGHER | ■■■ |
| ~4.9V | ■■ |
| ~4.3V | ■ |
| LOWER THAN 4.3V | LIGHTING OF DISCHARGE LAMP |

FIG. 3A

| THRESHOLD VOLTAGE OF BATTERY IN DIGITAL MODE | DISPLAY OF REMAINING BATTERY |
|---|---|
| 5.5V OR HIGHER | ■■■ |
| ~5.2V | ■■ |
| ~4.5V | ■ |
| LOWER THAN 4.5V | LIGHTING OF DISCHARGE LAMP |

FIG. 3B

DUAL-MODE RADIO COMMUNICATION DEVICE HAVING FUNCTION FOR SELECTIVELY USING ANALOG OR DIGITAL MODE

TECHNICAL FIELD

The present invention relates to a remaining battery display function of a dual-mode radio communication device selectively using an analog mode and a digital mode as a communication mode between the device and a base station, such as a car telephone and a portable telephone.

BACKGROUND ART

As is well-known, in a conventional dual-mode radio communication device, consumed current of a battery varies between an analog mode and a digital mode and so does a discharge (consumption) characteristic between them.

Even though a remaining amount of power of a battery (hereinafter referred to as a remaining battery) is displayed or an alarm for a decrease in voltage is raised (a DISCHARGE lamp lights up) on the basis of a preset threshold voltage, callable time will vary from mode to mode. For this reason, the conventional dual-mode radio communication device has a problem that a user cannot make use of the callable time effectively based on the display of a remaining battery or the alarm for a decrease in voltage.

DISCLOSURE OF INVENTION

The object of the present invention is to provide a dual-mode radio communication device capable of correctly alerting a user to a remaining battery corresponding to a communication mode.

In order to attain the above object, a dual-mode radio communication device according to the present invention has data of a battery consumption characteristic in an analog mode and that in a digital mode. The device determines a remaining battery based on data corresponding to a selected one of the analog and digital modes and alerts it to a user.

Consequently, according to the dual-mode radio communication device having the above constitution, the remaining battery corresponding to a communication mode can correctly be alerted to the user and accordingly the user can utilize his or her callable time with high efficiency.

BRIEF DESCRIPTION OF DRAWINGS

FIG. 3A is a table for explaining a threshold voltage level for displaying a remaining battery in a communication mode stored in a storage section; and FIG. 3B is a table for explaining a threshold voltage level for displaying a remaining battery in another communication mode stored in the storage section.

BEST MODE OF CARRYING OUT THE INVENTION

Hereinafter an embodiment of the present invention will be described with reference to the drawings.

Figure 1:
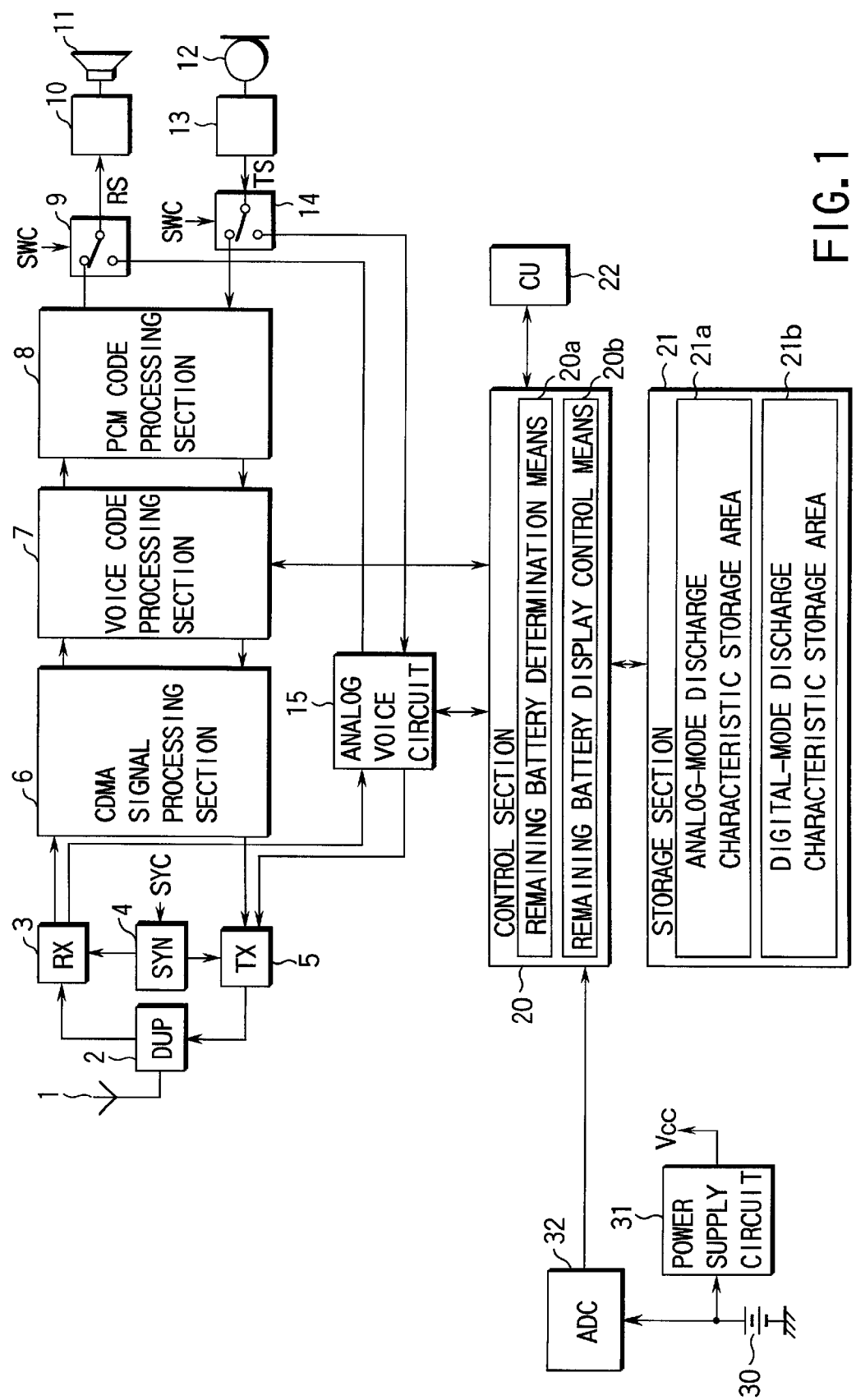
FIG. 1 is a circuit block diagram illustrating the constitution of a dual-mode radio communication device according to one embodiment of the present invention.

FIG. 1 illustrates the constitution of a dual-mode radio communication device according to the embodiment of the present invention. The dual-mode radio communication device illustrated in FIG. 1 includes two communication modes of an analog mode and a digital mode of a CDMA (code division multiple access) system.

When the dual-mode radio communication device is set in the digital mode, switching circuits 9 and 14 are each switched to a PCM code processing section 8 in response to a switching control signal SWC output from a control section 20.

In this state, a radio frequency signal, which is transmitted from a base station (not shown) through a digital channel, is received by an antenna 1 and then input to a reception circuit (RX) 3 via a duplexer (DUP) 2.

The radio frequency signal received by the reception circuit 3 is mixed with a received local oscillation signal output from a frequency synthesizer (SYN) 4 into an intermediate frequency signal whose frequency is varied. The frequency of the received local oscillation signal generated from the frequency synthesizer 4 is indicated by a control signal SYC output from the control section 20.

The received intermediate frequency signal is quadrature-demodulated in a CDMA signal processing section 6 and then spread inversely to extract reception data for the device. The extracted reception data is expanded in a voice code processing section 7 and converted to a digital reception signal.

The digital reception signal is decoded into an analog reception signal in the PCM code processing section 8. The analog reception signal is amplified by an amplifier 10 through the switching circuit 9 and then output from a speaker 11 loudly.

On the other hand, a transmission signal of a speaker input to a microphone 12 is amplified by an amplifier 13 and then supplied to the PCM code processing section 8 through the switching circuit 14.

The analog reception signal input to the PCM code processing section 8 is processed by PCM and converted into a digital transmission signal. After that, it is compressed by the voice code processing section 7 and input to the CDMA signal processing section 6 as transmission data.

The transmission data input to the CDMA signal processing section 6 is spread using a PN code corresponding to a transmission channel, then quadrature-demodulated and supplied to a transmission circuit (TX) 5.

In the transmission circuit 5, the quadrature-demodulated signal is synthesized with a transmitted local oscillation signal into a radio frequency signal, and this signal is high-frequency-amplified. The transmitted local oscillation signal is output from the frequency synthesizer 4 in response to an instruction of the control section 20.

The transmission radio frequency signal output from the transmission circuit 5 is supplied to the antenna 1 via the duplexer 2 and transmitted therefrom toward the base station (not shown).

Next, when the device is set in the analog mode, the switching circuits 9 and 14 are each switched to an analog voice circuit 15 in response to the switching control signal SWC output from the control section 20.

In this state, the radio frequency signal transmitted from the base station (not shown) through an analog channel, is received by the antenna 1 and then input to the reception circuit 3 via the duplexer 2. In this reception circuit 3, the radio frequency signal is frequency-converted to an intermediate frequency signal. The received intermediate frequency signal output from the reception circuit 3 is input to the analog voice circuit 15.

In the analog voice circuit 15, the received intermediate frequency signal is reproduced as an analog reception signal by FM demodulation. This analog reception signal is amplified by the amplifier 10 through the switching circuit 9 and then output from the speaker 11 loudly.

In contrast, the speaker's transmission signal output from the microphone 12 is amplified by the amplifier 13 and then input to the analog voice circuit 15 via the switching circuit 14. A modulated signal, which is FM-modulated in response to the transmission signal, is generated from the analog voice circuit 15, and supplied to the transmission circuit 5.

In the transmission circuit 5, the modulated signal is mixed with the transmitted local oscillation signal generated from the frequency synthesizer 4 and corresponding to the radio frequency of the analog channel and up-converted to a radio frequency signal. This signal is then high-frequency-amplified to a predetermined output level.

The radio frequency signal output from the transmission circuit 5 is supplied to the antenna 1 through the duplexer 2 and transmitted toward the base station (not shown) from the antenna 1.

The control section 20 includes a microcomputer as a main control section to exercise control over the respective sections for radio connection control and call control. The control section also includes a remaining battery determination means 20a and a remaining battery display control means 20b as new control functions.

The remaining battery determination means 20a is designed to determine a remaining battery level based on both detection results of a voltage detection circuit 32, which will be described later, and data stored in an analog-mode discharge characteristic storage area 21a or a digital-mode discharge characteristic storage area 21b.

The remaining battery display control means 20b is designed to control display of a remaining battery in an LCD display device of a control unit 22 in response to a determination result of the remaining battery determination means 20a.

The storage section 21 includes a semiconductor memory such as a ROM and a RAM as a storage medium. The storage medium has an area for storing various types of control data, various types of set data and dial data corresponding to abbreviated dialing as well as control programs of the control section 20 and ID data of the device itself necessary for authentication. The storage medium also has the analog and digital-mode discharge characteristic storage areas 21a and 21b.

Figure 2:
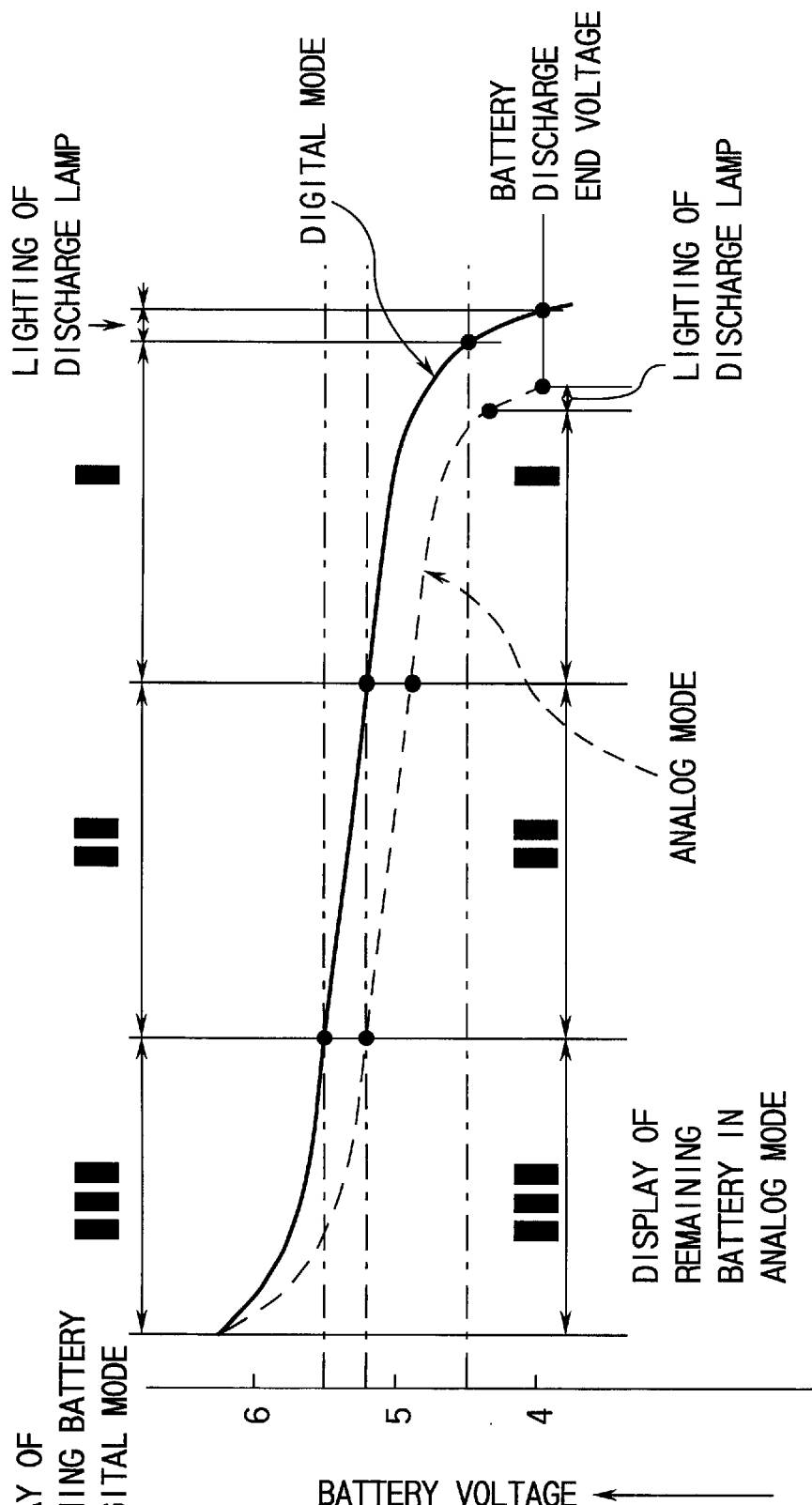
FIG. 2 is a graph showing battery discharge characteristics in an incoming-call standby status in each communication mode.

The analog-mode discharge characteristic storage area 21a is used to store threshold data of display of a remaining battery set on the basis of battery discharge (consumption) characteristics in an incoming-call standby status in the analog mode as shown in FIG. 2. One example thereof is shown in FIG. 3A.

The digital-mode discharge characteristic storage area 21b is used to store threshold data of display of a remaining battery set on the basis of battery discharge (consumption) characteristics in an incoming-call standby status in the digital mode as shown in FIG. 2. One example thereof is shown in FIG. 3B.

The control unit (CU) 22 is provided with a key group such as a dial key, a call key, a termination key, a volume control key and a mode designation key, an LCD display for displaying a telephone number of the party on the other end line, an operation status of the device and the like, and an LED lamp indicative of a discharge status of a battery 30 (which requires charge of a battery 30).

In FIG. 1, reference numeral 31 indicates a power supply circuit. The power supply circuit 31 generates an operating power supply voltage Vcc based on an output of the battery 30 and supplies it to each of the circuits.

The voltage detection circuit (ADC) 32 detects a voltage value of the battery 30 which varies with a consumed current and notifies the control section 20 of the detection result (digital data).

An alert operation of a remaining battery of the dual-mode radio communication device having the above constitution will now be described.

First, the remaining battery determination means 20a determines a battery remaining level on the basis of a voltage value of the battery 30 notified by the voltage detection circuit 32.

When the device is set in the analog mode, the voltage value of the battery 30 is compared with threshold data stored in the analog-mode discharge characteristic storage area 21a to determine the above remaining battery level. When the device is set in the digital mode, the voltage value is compared with threshold data stored in the digital-mode discharge characteristic storage area 21b to determine the above remaining battery level.

Next, the remaining battery display control means 20b causes a remaining battery to be displayed on the LCD display device of the control unit 22, as shown in FIGS. 3A and 3B, in response to a determination result of the remaining battery determination means 20a.

If the threshold voltage is 4.3V or lower in the analog mode and that is 4.5V or lower in the digital mode, the LED lamp of the control unit 22 lights up to notify a user that the battery will be exhausted soon. After that, both the level determination of the remaining battery determination means 20a and the display control of the remaining battery display control means 20b are repeated to notify the user of the remaining amount of battery 30.

As described above, the dual-mode radio communication device having the above constitution includes level determination data used when the analog mode is selected and level determination data used when the digital mode is selected. The remaining amount of battery 30 is determined on the basis of data of these level determination data which corresponds to a communication mode.

According to the foregoing dual-mode radio communication device, therefore, a user can correctly know the remaining battery corresponding to the communication mode and thus use callable time with efficiency.

Needless to say, various changes and modifications can be made without departing from the scope of the subject matter of the present invention.

What is claimed is:

1. A dual-mode radio communication device for communicating with a base station selectively using one of communication modes of an analog mode and a digital mode, comprising:

voltage detection means for detecting a voltage of a battery;

battery consumption characteristic storage means for storing both a battery consumption characteristic in the analog mode and a battery consumption characteristic in the digital mode;

remaining power amount detection means for detecting a remaining power amount of the battery from a detection result of the voltage detection means; and remaining power amount alert means for alerting a user to the remaining power amount detected by the remaining power amount detection means.

2. A dual-mode radio communication device according to claim 1, wherein the battery consumption characteristic storage means stores the voltage of the battery detected by the voltage detection means and the remaining power amount of the battery, as a battery consumption characteristic for each of the modes, by adapting the voltage of the battery to the remaining power amount of the battery step by step; and the remaining power amount alert means displays the remaining power amount in a stepwise display manner to alert the user to the remaining power amount.

3. A dual-mode radio communication device according to claim 2, wherein the remaining power amount alert means alerts the user in a display manner other than the stepwise display manner when the remaining power amount detected by the remaining power amount detection means is equal to or lower than a predetermined value.

4. A dual-mode radio communication device for communicating with a base station selectively using one of communication modes of an analog mode and a digital mode, comprising:

voltage detection means for detecting a voltage of a battery;

remaining power amount detection means for detecting a remaining power amount of the battery from a detection result of the voltage detection means based on a battery consumption characteristic corresponding to one of the analog mode and the digital mode; and remaining power amount alert means for alerting a user to the remaining power amount detected by the remaining power amount detection means.

5. A dual-mode radio communication device according to claim 4, wherein the battery consumption characteristic is obtained by adapting the voltage of the battery detected by the voltage detection means to the remaining power amount of the battery step by step for each of the analog mode and the digital mode; and the remaining power amount alert means displays the remaining power amount in a stepwise display manner to alert the user to the remaining power amount.

6. A dual-mode radio communication device according to claim 5, wherein the remaining power amount alert means alerts the user in a display manner other than the stepwise display manner when the remaining power amount detected by the remaining power amount detection means is equal to or lower than a predetermined value.

7. A dual-mode radio communication device for communicating with a base station selectively using one of communication modes of an analog mode and a digital mode, comprising:

voltage detection means for detecting a voltage of a battery;

remaining power amount detection means for detecting a remaining power amount of the battery from a detection result of the voltage detection means based on one of a battery consumption characteristic for the analog mode and a battery consumption characteristic for the digital mode; and remaining power amount alert means for alerting a user to information of the remaining power amount detected by the remaining power amount detection means.

8. A dual-mode radio communication device according to claim 7, wherein the remaining power amount detection means detects the remaining power amount of the battery from the detection result of the voltage detection means based on a characteristic corresponding to a communication mode selected by the radio communication device.

* * * * *